United States Patent
Sandhu et al.

(10) Patent No.: US 6,340,499 B1
(45) Date of Patent: *Jan. 22, 2002

(54) METHOD TO INCREASE GAS RESIDENCE TIME IN A REACTOR

(75) Inventors: Gurtej S. Sandhu; Ravi Iyer; Sujit Sharan, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/201,029

(22) Filed: Nov. 30, 1998

Related U.S. Application Data

(62) Division of application No. 08/950,549, filed on Oct. 15, 1997, now Pat. No. 5,935,336, which is a continuation of application No. 08/627,677, filed on Apr. 2, 1996, now Pat. No. 5,735,960.

(51) Int. Cl.$^7$ .............................................. C23C 16/00
(52) U.S. Cl. ................ 427/248.1; 427/569; 118/723 IR; 118/723 I; 118/715; 118/719
(58) Field of Search .............................. 427/248.1, 569; 118/723 IR, 733 I, 715, 719

(56) References Cited

U.S. PATENT DOCUMENTS

| | | |
|---|---|---|
| 4,767,641 A | 8/1988 | Kieser et al. |
| H566 H | 1/1989 | Nyaiesh et al. |
| 4,950,156 A | 8/1990 | Philipossian |
| 4,976,996 A | 12/1990 | Monkowski et al. |
| 5,006,192 A | 4/1991 | Deguchi |
| 5,131,752 A | 7/1992 | Yu et al. |
| 5,192,370 A | 3/1993 | Oda et al. |
| 5,234,529 A | 8/1993 | Johnson |
| 5,324,360 A | 6/1994 | Kozuka |
| 5,421,893 A | 6/1995 | Perlov |
| 5,589,737 A | 12/1996 | Barnes et al. |
| 5,605,599 A | 2/1997 | Benzing et al. |
| 5,637,180 A | 6/1997 | Gosain et al. |
| 5,647,912 A | 7/1997 | Kaminishizono et al. |
| 5,735,960 A * | 4/1998 | Sandhu et al. ......... 118/723 IR |
| 5,935,336 A * | 8/1999 | Sandhu et al. ......... 118/723 IR |
| 6,085,689 A * | 7/2000 | Sandhu et al. ......... 118/723 IR |

* cited by examiner

*Primary Examiner*—Jeffrie R. Lund
(74) *Attorney, Agent, or Firm*—Kirkpatrick & Lockhart LLP

(57) ABSTRACT

An apparatus is provided for controlling the flow of gaseous reactants in a CVD reactor through the use of a body having interior and exterior regions, in which the body defines at least one flow path between the interior and exterior regions so as to create a pressure drop from the interior to the exterior of the body within the chamber. The body is disposed in a reaction chamber with a first area proximate a gaseous reactant inlet and a second area proximate a substrate support such that the substrate is positioned in proximity to the interior of the body. As such, gaseous reactants introduced into the interior of said chamber through the inlet create a pressure drop between the interior and the exterior of the body. In a preferred embodiment, the body is cylindrically shaped and contains perforations providing the flow paths. Preferably, the perforations are either more numerous or larger in the second area than the first area to create a pressure gradient in the interior of the body. Alternatively, the perforations may be uniform in size and uniformly distributed over the body or the perforations can be configured to create a desired pressure differential in the body to support a plasma created in the body and control its location.

35 Claims, 3 Drawing Sheets

METHOD TO INCREASE GAS RESIDENCE TIME IN A REACTOR

This application is a division of application Ser. No. 08/950,549, filed Oct. 15, 1997, now U.S. Pat. No. 5,935,336 which is a continuation of Ser. No. 08/627,667 filed Apr. 2, 1996 now U.S. Pat. No. 5,735,960,

BACKGROUND OF THE INVENTION

1. Field of the Invention

The present invention relates generally to increasing the residence time of reactants in a reactor. More particularly, the present invention relates to an apparatus and method for increasing the gas residence time in a chemical vapor deposition reactor.

2. Description of the Invention Background

Chemical vapor deposition (CVD) is known as a technique for forming solid films on a substrate by the reaction of vapor phase chemicals near and preferably on the surface of the substrate to produce a solid film. CVD techniques have been particularly useful in the microelectronics industry because CVD techniques can be used to reliably produce extremely thin films, or layers, having good coverage characteristics and structural uniformity. In the production of electronic devices, CVD techniques are used to selectively deposit layers on a large wafer-shaped silicon substrate, or wafer, to form a plurality of complex electronic circuit elements separated by narrow streets. The wafers are then cut along the streets to separate the individual elements into chips, or dies, and leads are attached to form the electronic devices.

In general, CVD techniques involve the delivery of gaseous reactants to the surface of a substrate where chemical reactions take place under temperature and pressure conditions that are favorable to the thermodynamics of the desired reaction. The temperature of the reaction can be controlled by either controlling the temperature of the entire reactor, as in a hot-wall reactor, or by locally controlling the temperature of the substrate as in a cold-wall reactor. The energy supplied to the reactor to control the temperature can be entirely thermal, or can be partially plasma or photon induced.

The system pressure of the reactor is significant in controlling not only the rate of the chemical reactions, but the characteristics of the deposited film. Most early CVD reactors were atmospheric pressure CVD (APCVD) reactors, which provide for high deposition rates due to the relatively high concentration of the reactants and the high reaction rates that can be achieved at atmospheric pressures. However, many of the chemical reactions used to form the films occur at a sufficiently high rate at APCVD conditions that the transport of reactants to the surface is the rate limiting step in the reaction. In mass transport controlled reactions, the concentration of the reactants must be precisely controlled and uniformly maintained throughout the reactor in order to produce films having uniform thicknesses and good coverage characteristics. Another persistent problem in APCVD reactors is the thermodynamic favorability of homogeneous gas phase reactions that produce particulate contamination that often results in nonuniform, friable films on the substrate.

Low pressure CVD (LPCVD) reactors typically operate at pressures less than 100 torr and provide a solution to some of the problems encountered with APCVD reactors. In LPCVD reactors, the lower pressure results in increased reactant diffusivities and decreased reaction rates, which in some cases is sufficient to change the rate controlling step of the reaction from mass transport to the surface to the reaction rate at the surface. The formation of the film under reaction rate limited conditions is beneficial from the standpoint that reactors can be designed to process a large number of substrates at one time, because a uniform reactant concentrations are readily achievable in these systems, which in turn increases the probability of producing a uniform thickness film. In addition, LPCVD greatly reduces the extent of homogeneous gas phase reactions, which reduces the amount of particulate contamination of the film, resulting in a more structurally uniform film having greater step coverage and generally more desirable surface characteristics than produced by APCVD. One disadvantage of LPCVD is that the reaction rates are significantly lower than with APCVD at the same temperature; therefore, in order to produce films of the same thickness as produced using APCVD in LPCVD reactors, either the processing time will have to be increased and/or the LPCVD reactors must be operated at higher temperatures to increase the reaction rates. Alternatively, the partial pressures of the reactants can be increased to increase the reaction rate; however, increasing partial pressures of the reactants tends to increase the homogeneous gas phase reaction rates that tend to degrade the film characteristics.

Another complicating factor is the effect of flow rate on the formation and characteristics of the film. The extent of reaction, and the corresponding reactant concentration, is dependent upon the residence time of the reactants in the reactor, especially under mass transport rate controlled conditions. In many reactors, recirculation cells are formed during operation trapping reactants with the recirculation cell, such that the trapped reactants have a different residence time than gaseous reactants in other parts of the reactor. The variation in residence time results in nonuniform film formation due to gas phase compositional differences across the surface of the substrate. One possible solution to the problems associated with the formation of recirculation cells near the surface of the substrate is presented in U.S. Pat. No. 4,976,996 issued to Monkowski. The Monkowski patent provides for laminar parallel flow over the surface of a substrate using a cylindrical annular reactor in which the gaseous reactants are introduced into the reactor through the periphery and directed parallel to the surface of the substrate by flow controllers, such as straightening vanes. The gas is further prevented from recirculating through the use of a top portion that is directly opposite and parallel to the surface of the substrate and through the additional flow controllers at the annular exit of the reactor. While the apparatus of the Monkowski patent provides for a predictable flow pattern in the reactor, the constraints on the reactor design make it difficult to modify for processing large numbers of substrates at one time. Also, because the flow of gas is laminar and parallel to the surface of the substrate, the access of reactants to the surface substrate is limited to diffusion across the streamlines of the flow resulting in stratification of the reactants and, as a consequence, deposition rates may be undesirably decreased in the presence of parallel laminar flow.

The present invention is directed to apparatus for increasing the gas residence time of reactants in a CVD reactor which overcomes, among others, the above-discussed problems so as to provide a more efficient method of depositing uniform layers on substrate using the CVD techniques.

SUMMARY OF THE INVENTION

The above objects and others are accomplished by an apparatus and method in accordance with the present invention. The apparatus is provided for controlling the flow of gaseous reactants in a CVD reactor through the use of a body having interior and exterior regions, in which the body defines at least one flow path between the interior and exterior regions so as to create a pressure drop from the interior to the exterior of the body within the chamber. The body is disposed in a reaction chamber with a first area proximate a gaseous reactant inlet and a second area proximate a substrate support such that the substrate is positioned in proximity to the interior of the body. As such, gaseous reactants introduced into the interior of said chamber through the inlet create a pressure drop between the interior and the exterior of the body. In a preferred embodiment, the body is cylindrically shaped and contains perforations providing the flow paths. Preferably, the perforations are either more numerous or larger in the second area than the first area to create a pressure gradient in the interior of the body. Alternatively, the perforations may be uniform in size and uniformly distributed over the body or the perforations can be configured to create a desired pressure differential in the body to support a plasma created in the body and control its location.

Accordingly, the present invention provides increase in the efficiency of CVD techniques for producing uniform layers on substrates. These and other details, objects, and advantages of the invention will become apparent as the following detailed description of the present preferred embodiment thereof proceeds.

BRIEF DESCRIPTION OF THE DRAWINGS

Preferred embodiments of the present invention will be described in greater detail with reference to the accompanying drawings, wherein like members bear like reference numerals and wherein.

DETAILED DESCRIPTION OF THE PREFERRED EMBODIMENTS

Figure 1:
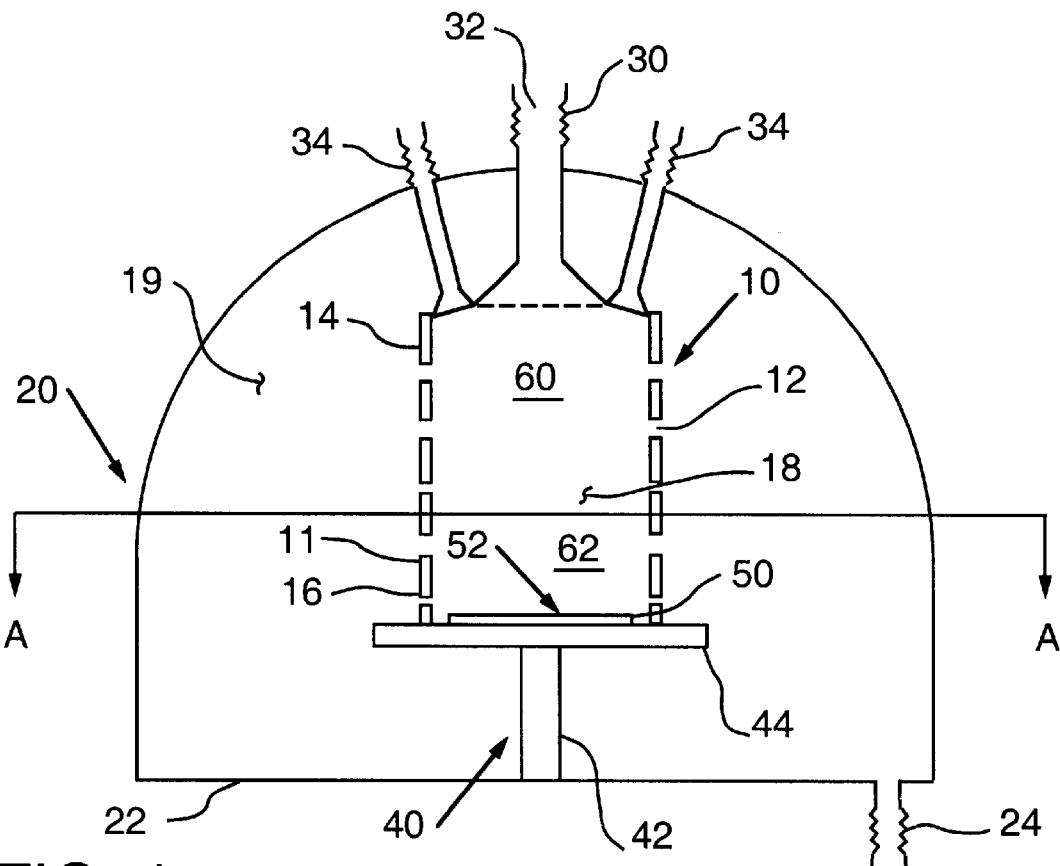
FIG. 1 is a side cross sectional view of the apparatus of the present invention in a reaction chamber.
Figure 2:
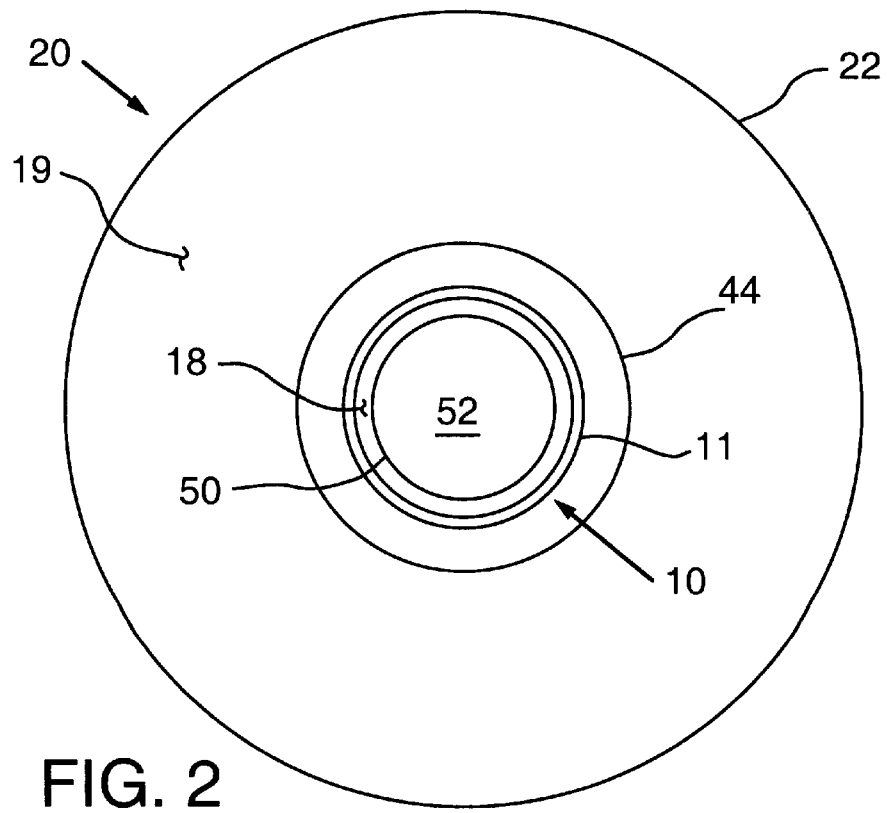
FIG. 2 is a top cross sectional view of the apparatus of FIG. 1 along line A—A.

The operation of the apparatus 10 will be described generally with reference to the drawings for the purpose of illustrating present preferred embodiments of the invention only and not for purposes of limiting the same. In accordance with the present invention, the apparatus 10 includes a body containing perforations, generally 12. The preferred shape and dimensions of the apparatus 10 will necessarily depend on the type of reactor and the parameters of the process in which the apparatus 10 is used. However, for illustrative purpose, the apparatus 10 will be described with reference to an idealized cold wall, low pressure, rapid thermal CVD processing reaction chamber 20 for treating one substrate 50 at a time. It can be appreciated that the shape and dimensions of the apparatus 10 can be easily modified to accommodate any shape or type of reactor or substrate within the spirit of the invention. The reaction chamber 20 has a base 22 containing an outlet or exhaust port 24. A reciprocally moveable susceptor 40 is attached to the base 22. The susceptor 40 has a support shaft 42 and a substrate support table 44 on which the substrate 50 to be treated using CVD techniques is placed. The gas reactants are introduced into the reaction chamber directly opposite the substrate support table 44 through the use of a shower head assembly 30 so that the gaseous reactants are directed toward the substrate 50. The substrate 50 is heated by conventional heating sources 34, such as high intensity heat lamps 34 and the pressure in the reaction chamber is controlled by a vacuum pump or other mechanism attached to the outlet port 24. Alternatively, heat may be applied to substrate support table 44 to heat the substrate 50.

In a preferred embodiment, the apparatus 10 is a cylindrically shaped body having a wall 11, an inlet end 14, a substrate end 16 and an interior and exterior region, 18 and 19, respectively, defined by the wall 11. The apparatus 10 also has a first area 60 extending approximately from said inlet end and over one-half the length of the body and a second area 62 extending the remainder of the length of body. The apparatus 10 is preferably disposed between the inlet for the reactants, i.e. the shower head 30 in FIG. 1, and the substrate support table 44, so as to direct and regulate the flow of the reactants near the surface 52 of the substrate 50 by controlling the relative pressures in interior region 18 and exterior region 19. It is therefore preferred that the inlet end 14 of the apparatus 10 extend proximate to the inlet 32 of the shower head 30 so that the flow of the gaseous species may be contained within the interior 18 of the apparatus 10 upon introduction into the chamber 20. In addition, the inlet end 14 can be enclosed to prevent the flow of the gaseous reactants out of the interior 18 of the apparatus 10 through the inlet 14.

The substrate end 16 of the apparatus 10 is preferably not in contact with the support table 44, but is in proximity thereto. By providing the substrate end 16 in proximity to the substrate 50 and the support table 44, the gap between the substrate end 16 and the support table 44 acts as a 360° perforation to the flow of the reactants. Alternatively, the substrate end 16 of the apparatus 10 may extend to the support table 44, such that the substrate 50 when placed on the support table is within the interior 18 of the apparatus 10.

Figure 3:
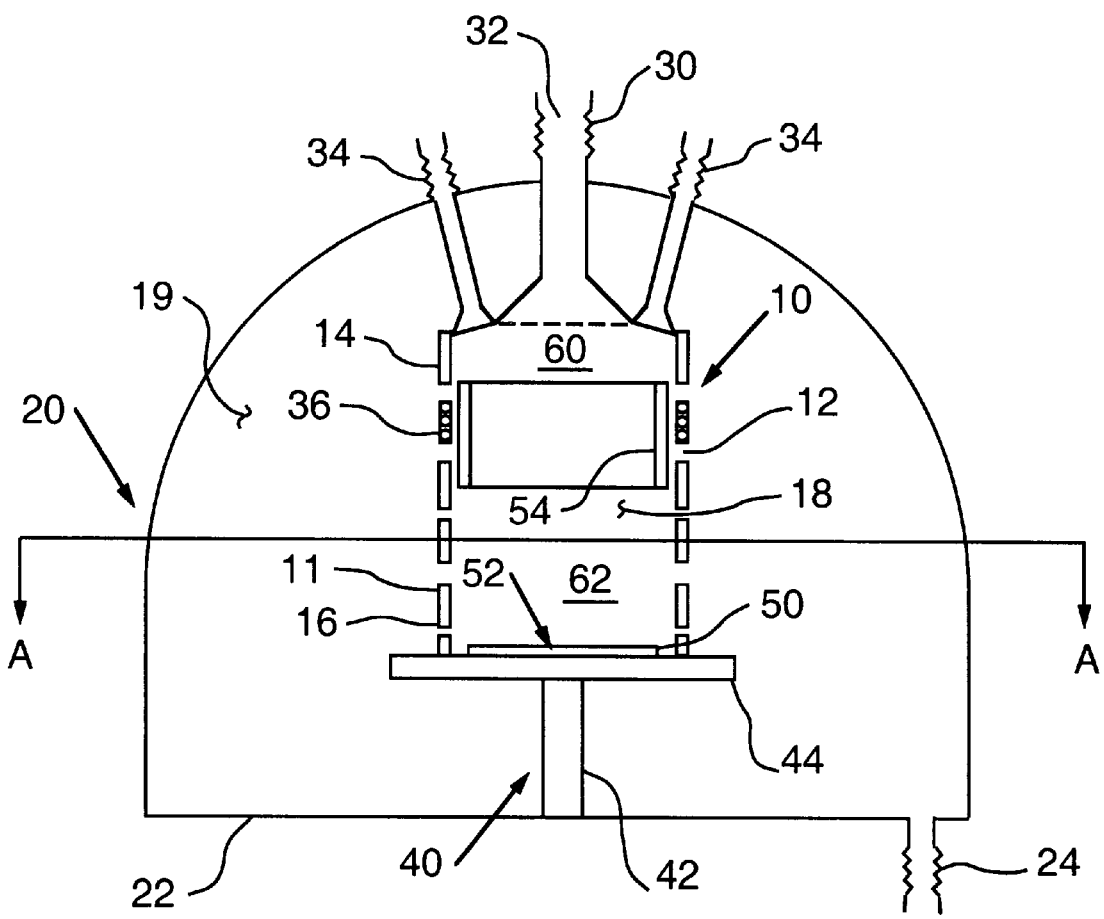
FIG. 3 is a side cross sectional view of an alternative embodiment of the present invention.
Figure 4:
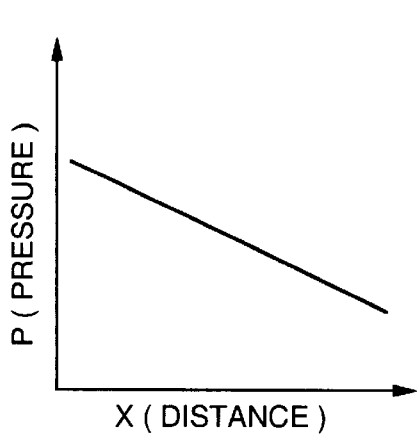
FIG. 4 is an exemplary diagram of pressure in interior 18 versus distance from shower head 30.

Preferably, the apparatus 10 contains perforations 12 in the wall 11 to provide fluid communication between the interior and the exterior regions, 18 and 19, respectively, of the apparatus 10, which are used to control the flow of the gaseous reactants within the chamber 20 and the residence time therein. Through the use of perforations 12, the apparatus 10 can be used to essentially create a distinct and separate environment in the interior region 18 of the apparatus 10 compared to the exterior region 19. The size and spacing of the perforations 12 can be particularized to set the pressure gradient in interior region 18 to achieve a desired flow pattern tailored to specific CVD technique used to deposit the layer. One embodiment of the invention is for the perforations 12 to be uniformly distributed both axially and circumferentially in the wall 11 of the apparatus 10 body and for the perforations 12 to be uniform in size. In addition, the substrate end 16 of the apparatus 10 preferably extends proximate to, but does not contact, the support table 44. A uniform distribution of perforations 12 serves to minimize the extent of recirculation within the apparatus 10 and to provide for a more uniform flow field. The objective of uniform flow field is further provided for by maintaining a spacing between the substrate end 16 and the support table 44 that preferably provides a path of least resistance so that the flow is well behaved in the vicinity of substrate surface 52 and also provides for directing a significant percentage of the gaseous reactants toward the surface 52 of the substrate 50. Alternatively, as shown in FIG. 3, the perforations 12 can be preferably located in greater numbers or of larger sizes toward either end of the apparatus 10 to produce other flow effects. For instance, by preferably locating more of the perforations 12 closer to the inlet end 14, a pressure gradient may be formed in interior region 18 causing the flow field nearer the substrate 50 can be made to be more stagnant and, conversely, a greater distribution or size of perforations 12 near the substrate end 16 can be used to increase the flow and percentage of gaseous reactants in the vicinity of the substrate 50. By means of example, the pressure in the exterior may be 1 torr while the pressure in the first area is 10 torr and that in the second area is 5 torr. It will be appreciated that flow paths defined by the apparatus 10 can be provided in any form, such as through the use of a second body 54 within the apparatus 10 to control the flow and, hence, the pressure differential, between interior and exterior regions, 18 and 19, respectively.

The apparatus body 10 is preferably constructed of quartz, aluminum, steel, silicon oxide, alumina or other ceramics to provide more flexibility in the positioning of heating sources 34 within the reaction chamber 20, but can be any material suitable to withstand CVD operating conditions can be used for the apparatus 10. However, the thickness of the material should be minimized to reduce the latent cooling times between batch operations.

While current preferred embodiments have been generally discussed with respect to a reaction chamber that is heated using a heating source 34 providing either entirely thermally or thermally assisted photon induced heating, the apparatus 10 can be used with plasma enhanced CVD reactors. The apparatus 10 may include perforations 12 which are sized and located so as to create desired pressure and temperature conditions where the plasma is to be created and sustained depending on preferred reactions. We believe that the plasma will reside in an equilibrium location dependent, in part, on electrode location. The apparatus 10 can be constructed from suitable material for use in a plasma CVD reactor and the plasma can be formed by inductively coupled coils 36, e.g., in the apparatus body 10 in table 44 and shower head 30. Alternatively, as shown in FIG. 3, the apparatus 10 may be formed from a composite of materials having varying properties along the length of the apparatus 10 between the inlet end 14 and the substrate end 16, such as a generally quartz apparatus 10 containing the radio frequency (rf) inductively coupled coils 36 composed of coated metal, such as copper or aluminum. In this manner, the apparatus 10 can be used to very locally produce plasma at any given elevation with respect to the substrate 50. In addition, the perforations 12 are preferably distributed to facilitate plasma formation, which provides for additional flexibility in the system. For example, the perforations 12 may be more numerous or larger in the first area 60 than in the second area 62 so that the pressure in interior 18 is higher in the second area 62 than in the first area 60 thereby encouraging plasma residence in second area 62.

In the use of the apparatus of the present invention, the inlet end 14 of the apparatus 10 can be attached to the wall of the chamber 20 by any conventional method, such as a common support, so that the apparatus 10 hangs freely and the inlet end 14 is adjacent to the gaseous reactant inlet 32. A substrate 50 that is to be treated using CVD is placed inside the reaction chamber 20 through a loading port onto the support table 44 of the susceptor 40 with the susceptor 40 reciprocated in the retracted or loading/unloading position. The susceptor 40 is then extended to a treatment position such that the substrate 50 in close proximity to the apparatus 10, as shown in FIG. 1. The reaction chamber 20 is evacuated through outlet port 24 to a pressure typically ranging from $10^{-3}$ to $10^{-8}$ torr. The heating sources 34 are used to bring the chamber 20 up to operating temperature and an inert gas carrier is introduced through the shower head 30 to bring the reaction chamber pressure to operating conditions, which are typically in the vicinity of 10 millitorr. Once the operating conditions have been established, the reactants are introduced into the interior region 18 of the apparatus 10 which create a pressure differential within the interior 18 as well as a pressure drop between the interior 18 and the exterior 19 of the apparatus 10 thereby controlling the flow pattern and pressure distribution during the CVD processing.

Figure 5:
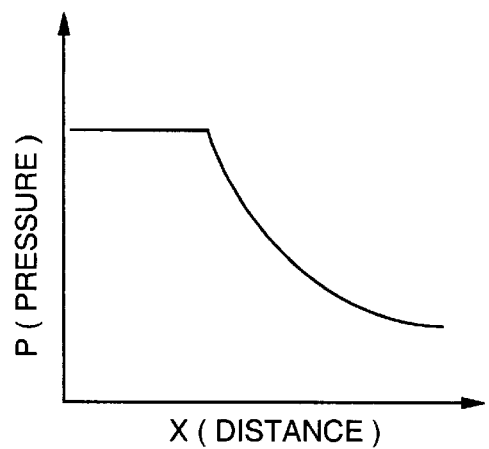
FIG. 5 is another such pressure versus distance diagram.
Figure 6:
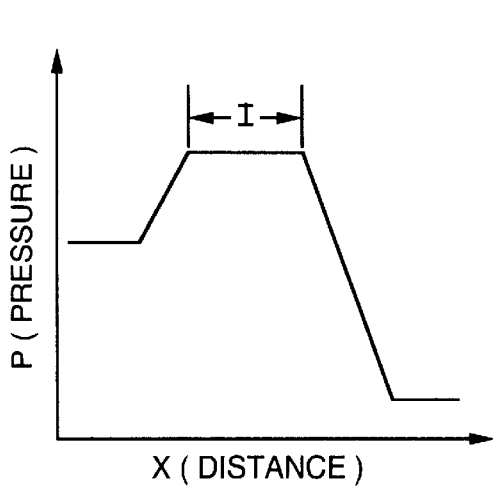
FIG. 6 is another such pressure versus distance diagram when a plasma CVD process is used.
Figure 7:
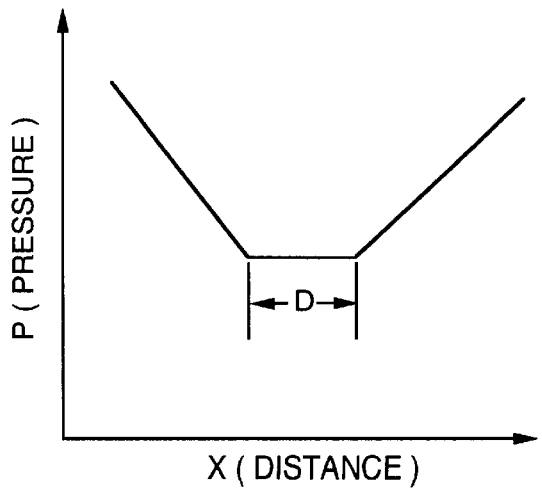
FIG. 7 is yet another such pressure versus distance diagram when a plasma CVD process is used.

Examples of some of the pressure gradients which may be achieved in interior region 18 are shown in FIGS. 4–7 wherein pressure is shown as a function of distance ("X") from shower head 30 toward substrate support table 44. For example, in FIG. 4, the size and spacing of perforations 12 are designed to produce a rather linear pressure drop dependent on distance X. In FIG. 5, the pressure is kept constant in first area 60 and drops off in area 62. FIGS. 6 and 7 depict possible pressure gradients when a plasma CVD process is to be employed. In FIG. 6, an area of increased pressure "I" is created to enhance plasma formation and maintenance, whereas in FIG. 7, an area of relatively decreased pressure "D" is formed to maintain different plasma characteristics.

Those of ordinary skill in the art will appreciate that the present invention provides advantages over the current state of the art performing CVD processes. In particular, the present invention provides an apparatus and technique for controlling the flow and pressure fields which are known to affect the characteristic of the deposited layer. While the subject invention provides these and other advantages over the prior art, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. A method of controlling the flow of gaseous reactants in a reaction chamber containing a wafer, comprising:
   introducing the gaseous reactants into the chamber to an interior region adjacent to the wafer; and
   removing the gaseous reactants from the interior region via a plurality of non-uniform flow paths to an exterior region within the chamber and adjacent to the interior region, the exterior region having a lower concentration of gaseous reactants than the interior region.

2. The method of claim 1 wherein said removing the gaseous reactants includes reducing pressure from the interior region to the exterior region.

3. The method of claim 1 wherein said removing the gaseous reactants includes inducing the gaseous reactants through a plurality of non-uniform flow paths to provide a substantially linear pressure in the interior region dependent on increasing distance from the wafer.

4. The method of claim 1 further comprising controlling the temperature and pressure within the reaction chamber to prespecified conditions.

5. The method of claim 1 wherein said introducing gaseous reactants includes introducing the gaseous reactants directly into the interior region.

6. A method of controlling the flow of gaseous reactants in a reaction chamber comprising:
  introducing the gaseous reactants into an interior region of a hollow body;
  inducing a pressure differential within the interior region; and
  distributing the gaseous reactants from a location in the interior region to a location in an exterior region to produce a desired flow pattern within the interior region.

7. The method of claim 6, wherein said distributing includes inducing a desired pressure drop from the interior region to the exterior region when the gaseous reactants are introduced into the interior region.

8. The method of claim 7 wherein said inducing includes inducing the gaseous reactants through a plurality of non-uniform flow paths to provide a substantially linear pressure in the interior region dependent on increasing distance from a substrate support.

9. The method of claim 7 wherein said inducing includes inducing the gaseous reactants through a plurality of non-uniform flow paths to provide a pressure area created to enhance plasma formation and maintenance.

10. A method of controlling the flow of gaseous reactants in a reaction chamber comprising:
  introducing the gaseous reactants into an interior region of a hollow body, the interior region having a first area and a second area;
  inducing a pressure differential between the first area and the second area; and
  distributing the gaseous reactants from a location in the interior region to a location in an exterior region to produce a desired flow pattern within the interior region.

11. The method of claim 10 wherein said distributing includes flowing the gaseous reactants through a plurality of non-uniform flow paths through the body.

12. The method of claim 10 wherein said inducing includes inducing the gaseous reactants through a plurality of flow paths to provide a substantially linear pressure drop in the interior region dependent on increasing distance from a substrate support.

13. The method of claim 10 wherein said inducing includes inducing the gaseous reactants through a plurality of flow paths to provide a pressure area created to enhance plasma formation and maintenance.

14. A method of controlling the flow of gaseous reactants in a reaction chamber comprising:
  introducing the gaseous reactants into an interior region of a hollow body, the interior region having a first area and a second area;
  inducing flow around a second body contained within the interior region to produce a pressure differential between the first area and the second area; and
  distributing the gaseous reactants from a location in the interior region to a location in an exterior region to produce a desired flow pattern within the interior region.

15. The method of claim 14 wherein the pressure differential is further produced by a plurality of non-uniform flow paths through the body.

16. A method of controlling the flow of gaseous reactants in a reaction chamber comprising:
  introducing the gaseous reactants into an interior region of a hollow body, the interior region having a first area and a second area;
  inducing a pressure differential between the first area and the second area to facilitate plasma formation; and
  distributing the gaseous reactants from a location in the interior region to a location in an exterior region to produce a desired flow pattern within the interior region.

17. The method of claim 16 wherein said distributing includes flowing the gaseous reactants through a plurality of non-uniform flow paths through the body.

18. The method of claim 16 further comprising controlling the temperature and pressure within the reaction chamber to prespecified conditions.

19. A method of controlling the flow of gaseous reactants in a reaction chamber comprising:
  introducing the gaseous reactants into a first area of an interior region of a hollow body, the interior region further having a second area;
  inducing a pressure differential between the first area and the second area such that the gaseous reactants have a greater flow in the first area than the second area, and
  distributing the gaseous reactants from a location in the interior region to a location in an exterior region to produce a desired flow pattern within the interior region.

20. The method of claim 19, wherein said distributing includes flowing the gaseous reactants through a plurality of non-uniform flow paths through the body.

21. A method of controlling the flow of gaseous reactants in a reaction chamber comprising:
  introducing the gaseous reactants into a first area of an interior region of a hollow body, the interior region further having a second area;
  inducing a pressure differential between the first area and the second area such that the gaseous reactants have a greater flow in the second area than the first area; and
  distributing the gaseous reactants from a location in the interior region to a location in an exterior region to produce a desired flow pattern within the interior region.

22. The method of claim 21 wherein said distributing includes flowing the gaseous reactants through a plurality of non-uniform flow paths through the body.

23. A method of controlling the flow of gaseous reactants in a reaction chamber comprising:
  introducing the gaseous reactants into an interior region of a hollow body; and
  distributing the gaseous reactants through non-uniform flow paths from a location in the interior region to a location in an exterior region.

24. The method of claim 23 further comprising controlling the temperature and pressure within the reaction chamber to prespecified conditions.

25. The method of claim 23 wherein said introducing gaseous reactants includes introducing the gaseous reactants directly into the interior region.

26. The method of claim 25 wherein said introducing gaseous reactants includes directing the gaseous reactants toward a substrate.

27. The method of claim 23 wherein the flow paths are configured to cause a pressure differential and a desired flow pattern within the interior region.

28. The method of claim 23 wherein the flow paths are configured to support a plasma at a location in the interior region.

29. The method of claim 23 further comprising inducing a desired pressure drop from the interior region to the exterior region when the gaseous reactants are introduced into the interior region.

30. The method of claim 29 wherein said inducing includes inducing the gaseous reactants through the plurality of flow paths to provide a substantially linear pressure drop in the interior region dependent on increasing distance from a substrate support.

31. The method of claim 29 wherein said inducing includes inducing the gaseous reactants through the plurality of flow paths to provide a pressure area created to enhance plasma formation and maintenance.

32. A method of forming a layer on a substrate using gaseous reactants, comprising:

introducing the gaseous reactants into an interior region of a hollow body;

increasing the flow and percentage of the gaseous reactants in the vicinity of the substrate; and distributing the gaseous reactants through non-uniform flow paths from a location in the interior region to a location in an exterior region.

33. The method of claim 32 further comprising inducing a desired pressure drop from the interior region to the exterior region when the gaseous reactants are introduced into the interior region.

34. The method of claim 33 wherein said distributing includes flowing the gaseous reactants through the plurality of flow paths to provide a substantially linear pressure in the interior region dependent on increasing distance from a substrate support.

35. The method of claim 32 wherein the flow paths are configured to cause a pressure differential and a desired flow pattern within the interior region.

* * * * *

UNITED STATES PATENT AND TRADEMARK OFFICE
CERTIFICATE OF CORRECTION

PATENT NO. : 6,340,499 B1
DATED : January 22, 2002
INVENTOR(S) : Sandhu et al.

It is certified that error appears in the above-identified patent and that said Letters Patent is hereby corrected as shown below:

Column 5,
Line 11, delete "can be made"
Line 26, delete "can be"

Signed and Sealed this

Twelfth Day of November, 2002

Attest:

Attesting Officer

JAMES E. ROGAN
Director of the United States Patent and Trademark Office